(12) United States Patent
Yazzie et al.

(10) Patent No.: US 11,022,792 B2
(45) Date of Patent: Jun. 1, 2021

(54) COUPLING A MAGNET WITH A MEMS DEVICE

(71) Applicant: Intel Corporation, Santa Clara, CA (US)

(72) Inventors: Kyle Yazzie, San Tan Valley, AZ (US); Anna M. Prakash, Chandler, AZ (US); Suriyakala Ramalingam, Chandler, AZ (US); Liwei Wang, Phoenix, AZ (US); Robert Starkston, Phoenix, AZ (US); Arnab Choudhury, Santa Clara, CA (US); Sandeep S. Iyer, Chandler, AZ (US); Amanuel M. Abebaw, Chandler, AZ (US); Nick Labanok, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/464,257

(22) PCT Filed: Dec. 27, 2016

(86) PCT No.: PCT/US2016/068635
§ 371 (c)(1),
(2) Date: May 24, 2019

(87) PCT Pub. No.: WO2018/125027
PCT Pub. Date: Jul. 5, 2018

(65) Prior Publication Data
US 2019/0391386 A1    Dec. 26, 2019

(51) Int. Cl.
*G02B 26/08* (2006.01)
*B81C 3/00* (2006.01)

(52) U.S. Cl.
CPC ............ *G02B 26/085* (2013.01); *B81C 3/001* (2013.01); *B81B 2201/038* (2013.01);
(Continued)

(58) Field of Classification Search
None
See application file for complete search history.

(56) References Cited

U.S. PATENT DOCUMENTS

2005/0002085 A1    1/2005   Matsui
2005/0249487 A1*  11/2005  Gutierrez ................. G03B 3/10
                                                  396/85
(Continued)

FOREIGN PATENT DOCUMENTS

JP    2008242207 A    10/2008
JP    2013126337 A     6/2013
WO    2018125027 A1    7/2018

OTHER PUBLICATIONS

PCT International Search Report and Written Opinion issued in PCT/US2016/068635 dated Sep. 12, 2017; 11 pages.

*Primary Examiner* — William B Perkey
(74) *Attorney, Agent, or Firm* — Patent Capital Group

(57) ABSTRACT

Aspects of the embodiments are directed to coupling a permanent magnet (PM) with a microelectromechanical systems (MEMS) device. In embodiments, an adhesive, such as an epoxy or resin or other adhesive material, can be used to move the PM towards the MEMS device to magnetically couple the PM to the MEMS device. In embodiments, an adhesive that is configured to shrink up on curing can be applied (e.g., using a pick and place tool) to a location between the MEMS device and the PM. As a result of curing, the adhesive can pull the PM towards the MEMS device. In embodiments, an adhesive that is configured to expand as a result of curing can be applied to a location between the PM and a sidewall of the chassis. As a result of curing, the adhesive can push the PM towards the MEMS device. The adhesive can also secure the PM in place.

20 Claims, 19 Drawing Sheets

(52) U.S. Cl.
CPC ... *B81B 2201/042* (2013.01); *B81B 2207/012* (2013.01); *B81C 2203/032* (2013.01); *B81C 2203/057* (2013.01)

(56) References Cited

U.S. PATENT DOCUMENTS

| | | | |
|---|---|---|---|
| 2006/0204242 A1* | 9/2006 | Gutierrez | G03B 3/10 |
| | | | 396/439 |
| 2010/0149073 A1* | 6/2010 | Chaum | G02B 27/0172 |
| | | | 345/8 |
| 2012/0102730 A1 | 5/2012 | Orcutt | |
| 2012/0119614 A1* | 5/2012 | Gutierrez | G02B 7/102 |
| | | | 310/300 |
| 2012/0120308 A1* | 5/2012 | Gutierrez | G03B 3/10 |
| | | | 348/374 |
| 2016/0124214 A1 | 5/2016 | Freedman et al. | |
| 2020/0011974 A1* | 1/2020 | Duan | G01S 17/42 |
| 2020/0310107 A1* | 10/2020 | Kojima | B25J 9/1697 |

\* cited by examiner

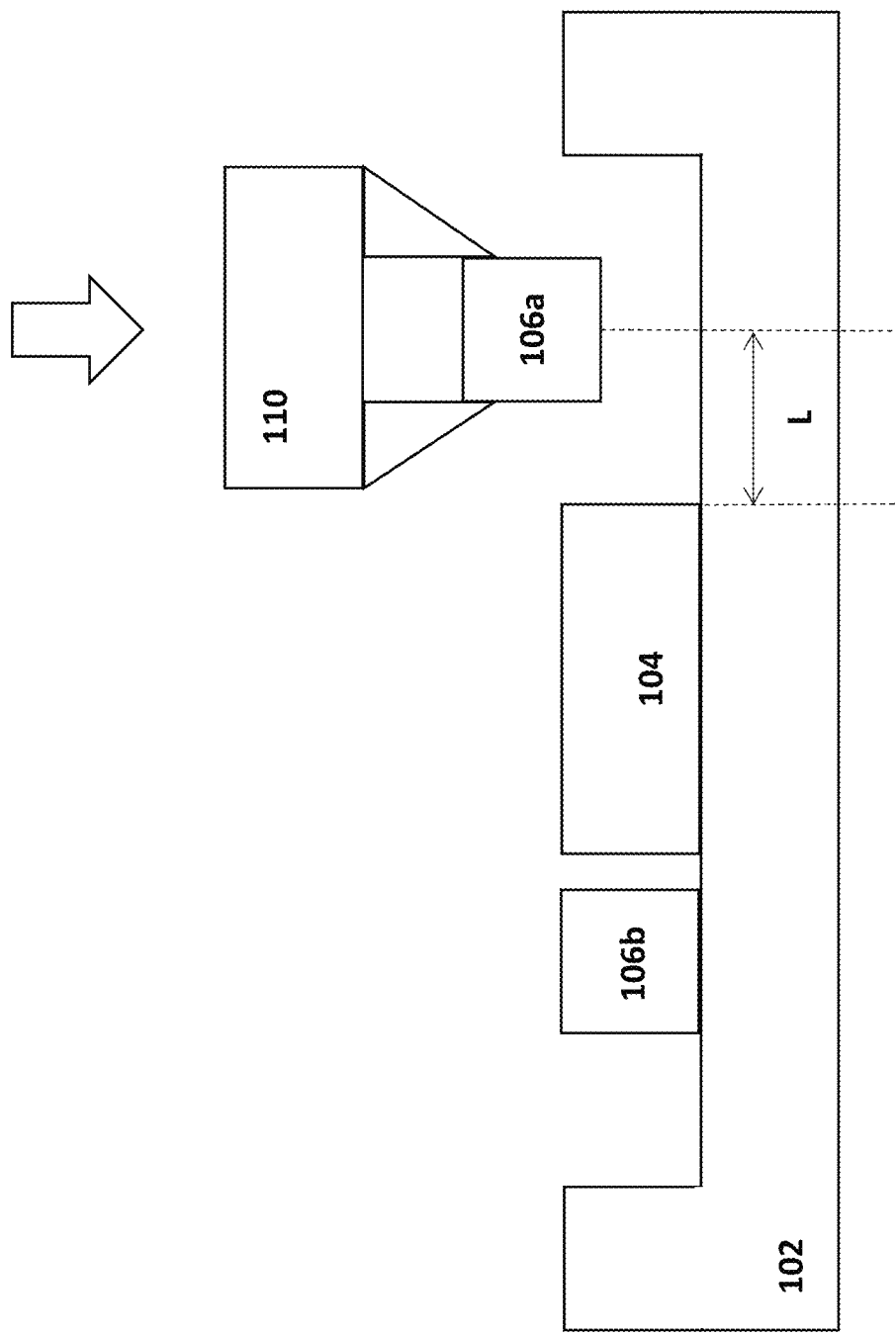

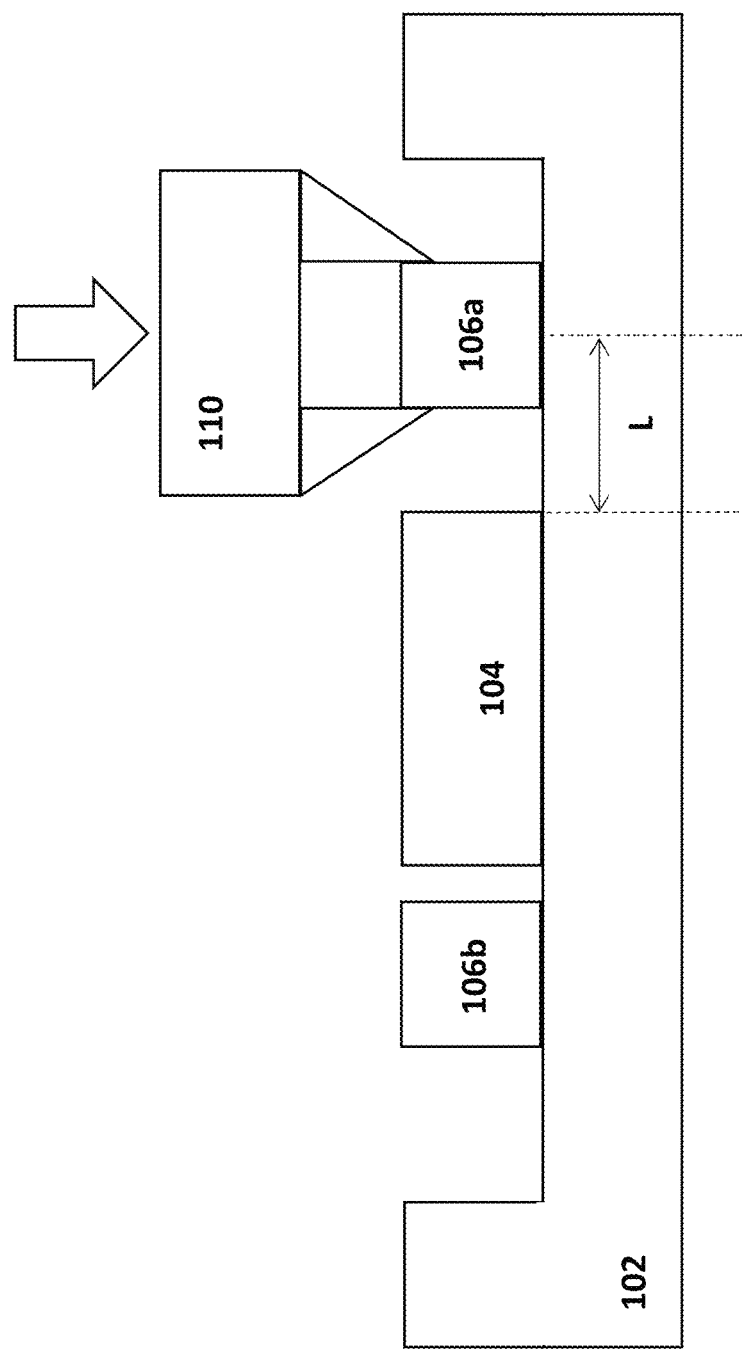

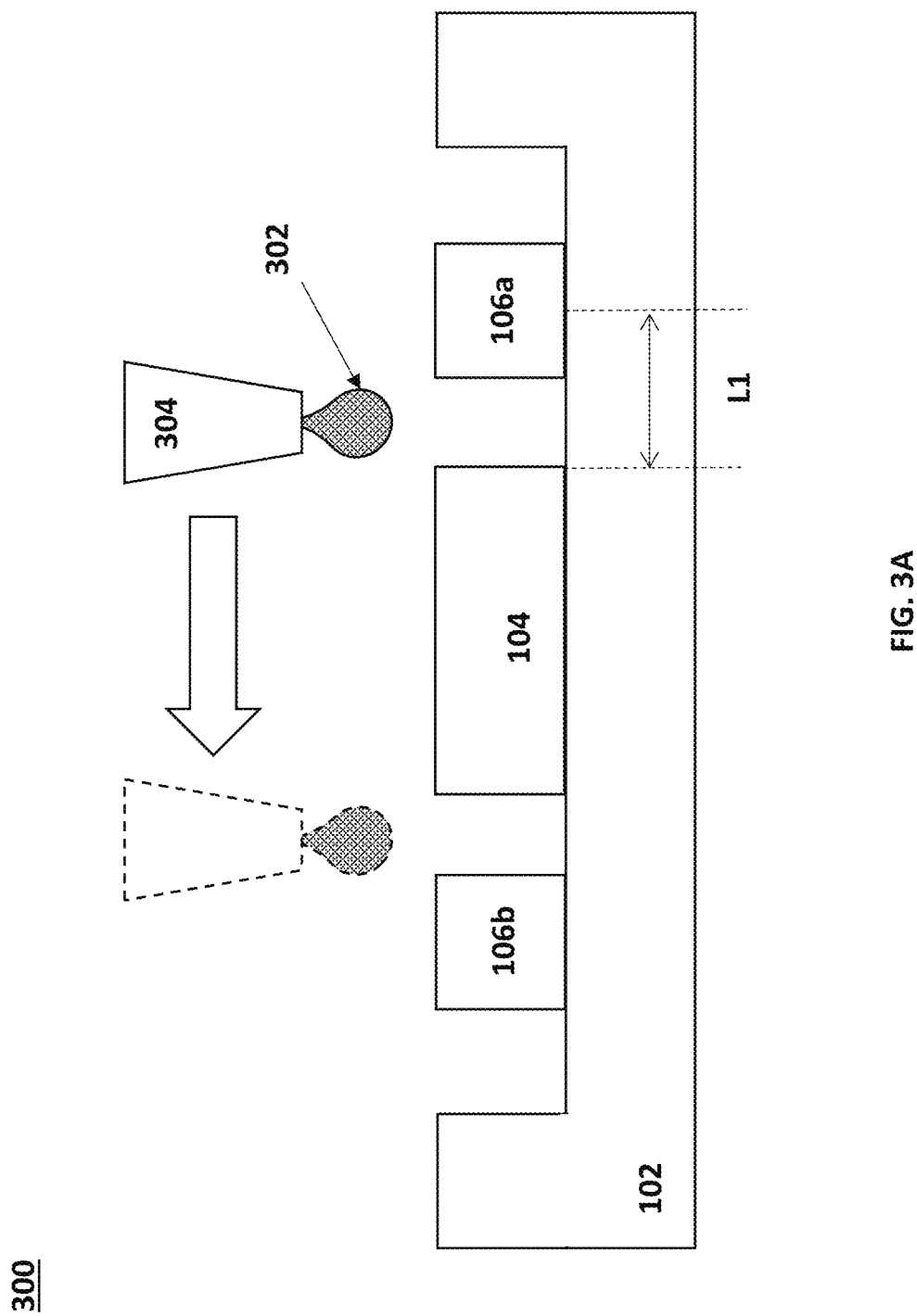

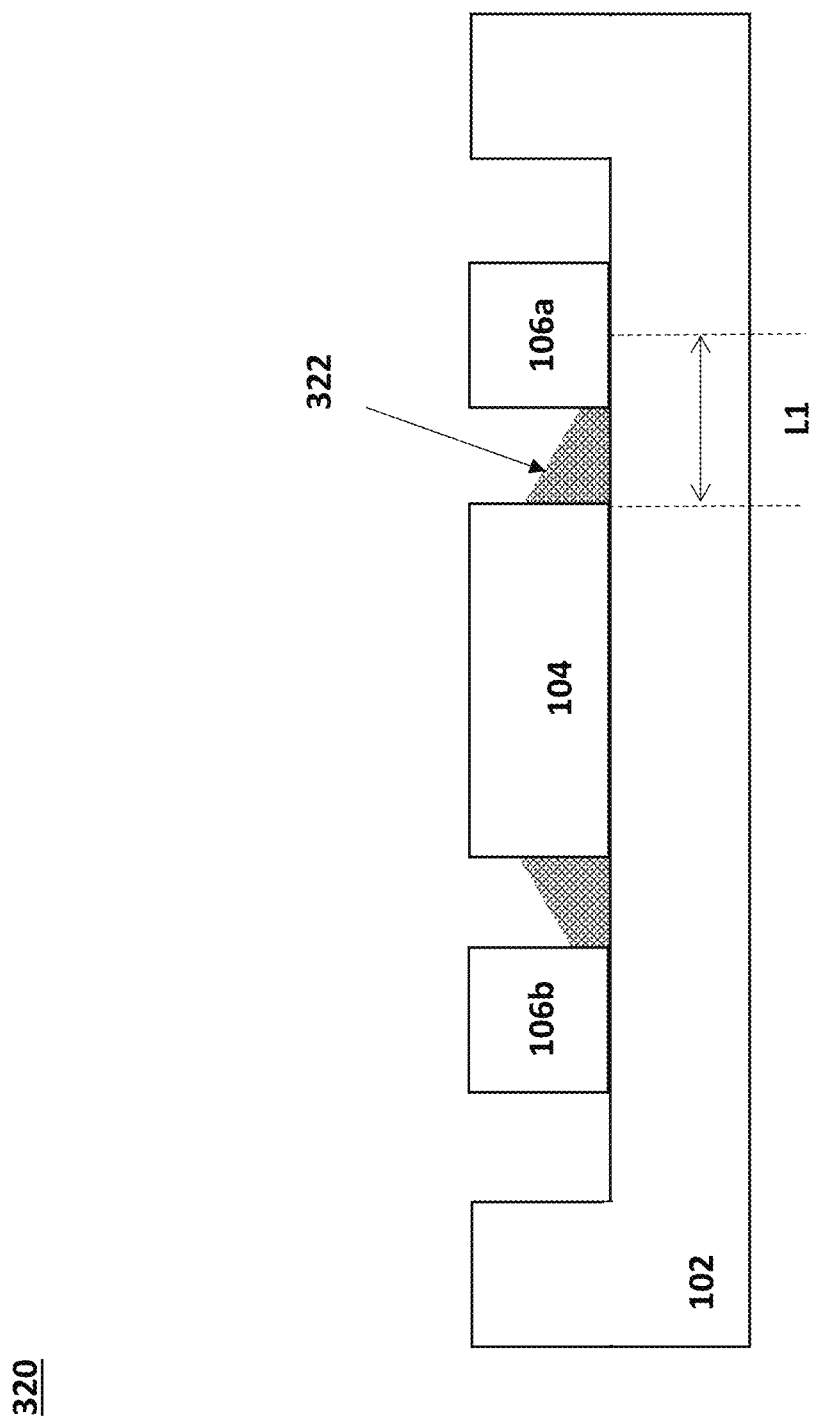

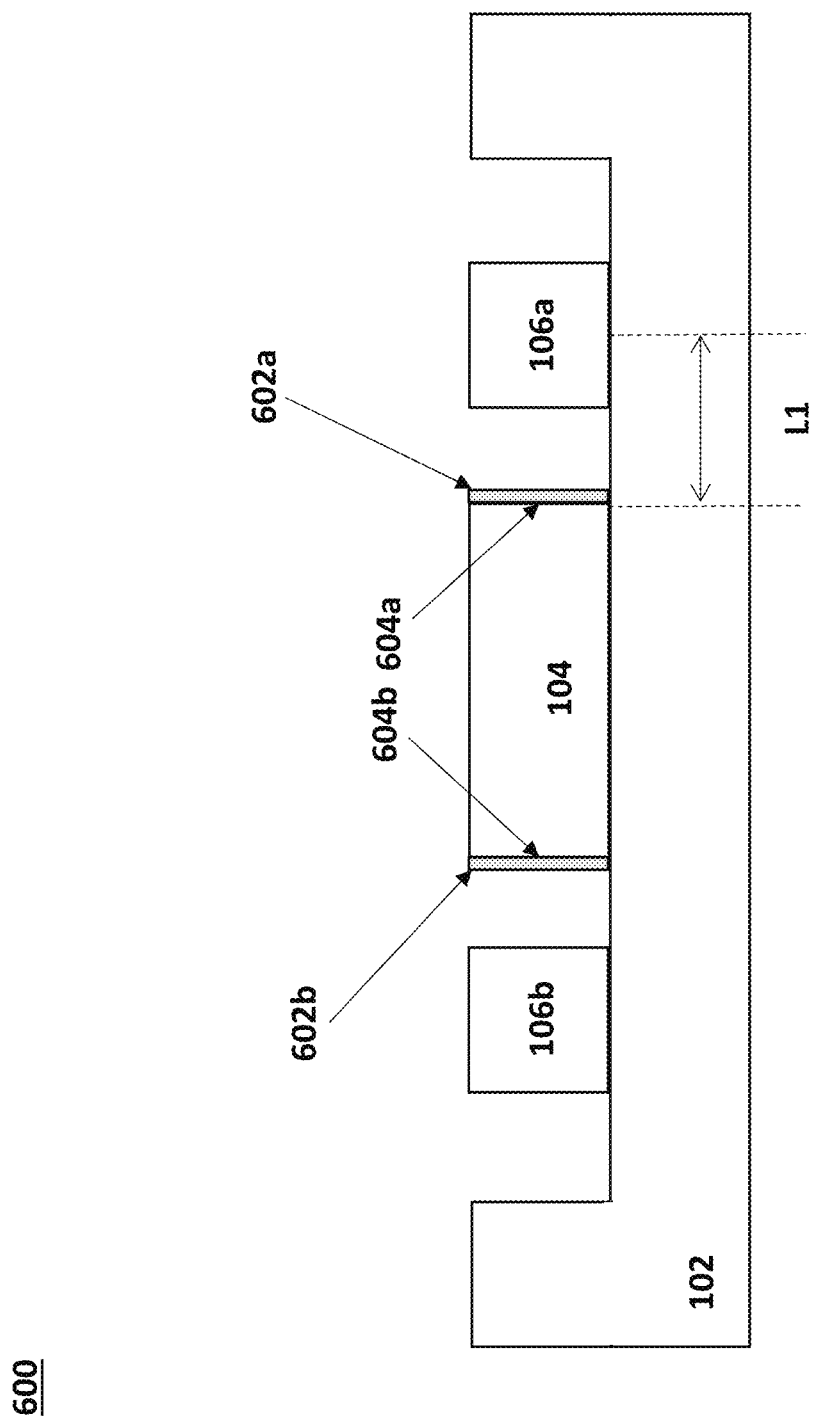

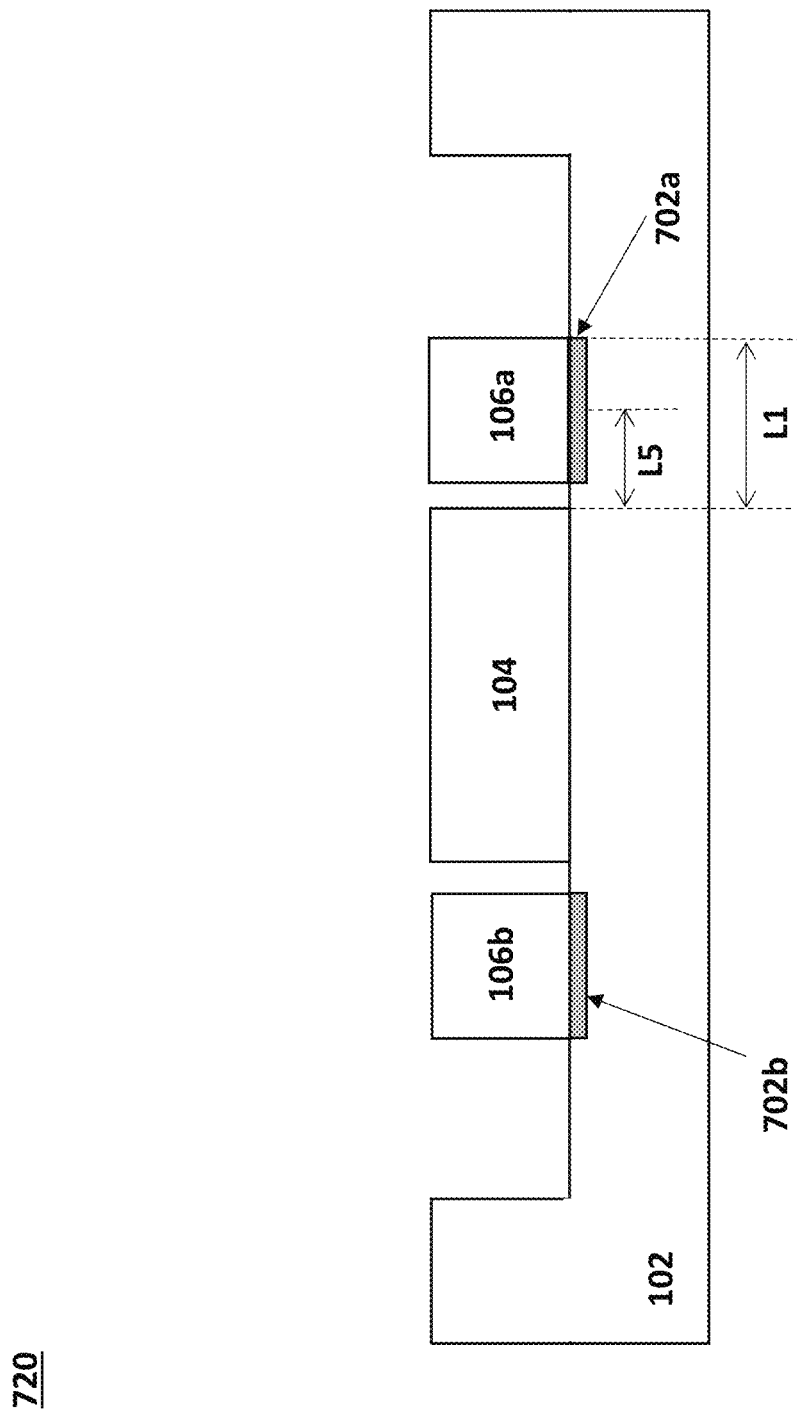

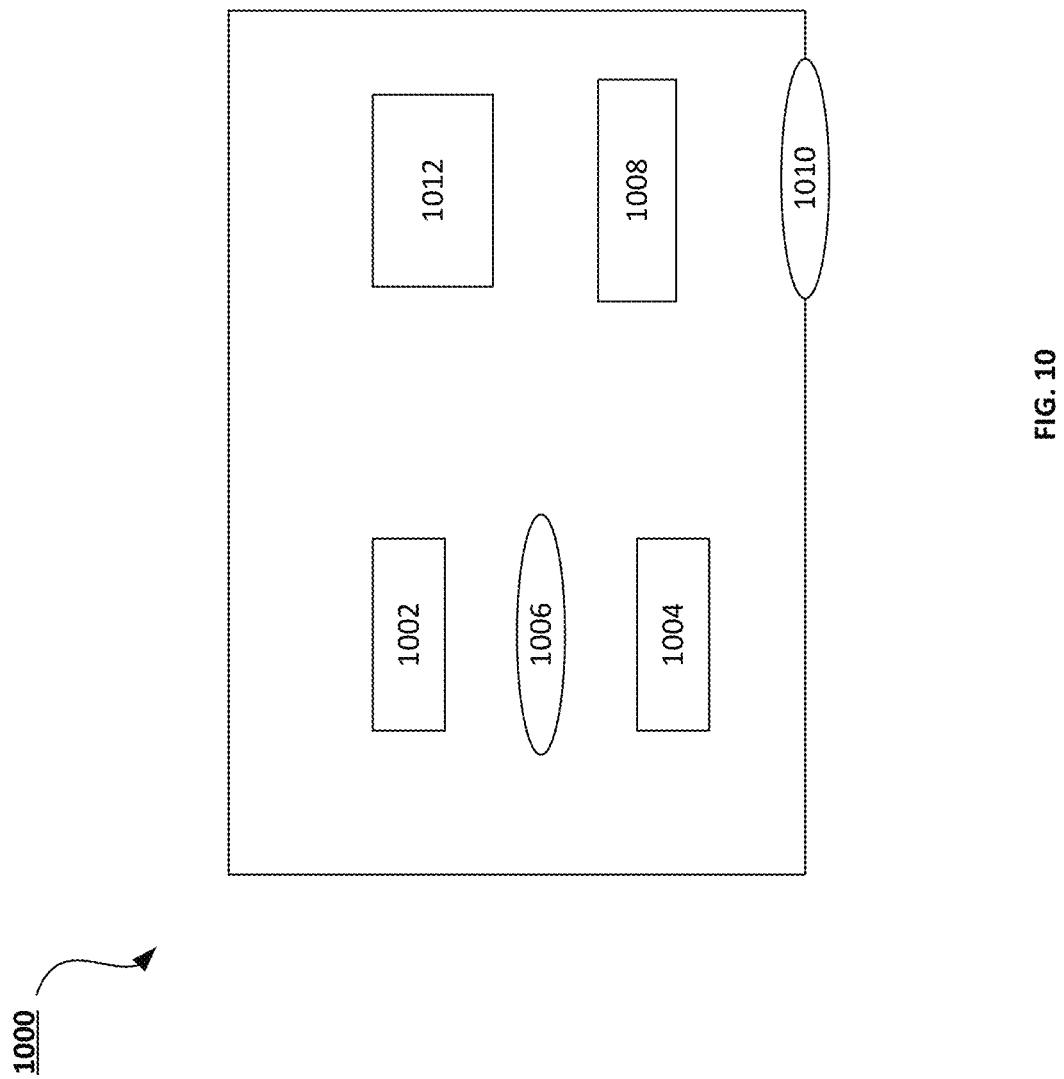

COUPLING A MAGNET WITH A MEMS DEVICE

CROSS-REFERENCE TO RELATED APPLICATION

This application is a national stage application under 35 U.S.C. § 371 of PCT International Application Serial No. PCT/US2016/068635, filed on Dec. 27, 2016 and entitled "COUPLING A MAGNET WITH A MEMS DEVICE," which is hereby incorporated by reference herein in its entirety.

TECHNICAL FIELD

This disclosure pertains to coupling between a magnet and a micro-electro-mechanical system (MEMS) device.

BACKGROUND

Magnetic coupling in multi-axis MEMS mirrors is a strongly dependent on the proximity of a magnets to the device. Power to drive the MEMS device rapidly drops off with distance, and performance of the device is sacrificed. Pick and place tools can position a magnet with a few tens of micrometers from the MEMS.

BRIEF DESCRIPTION OF THE DRAWINGS

FIGS. 2A-2C are schematic diagrams illustrating picking and placing a magnet onto a chassis.

FIGS. 3A-3C are schematic diagrams illustrating an example application of a shrinking epoxy for coupling a magnet to a MEMS device in accordance with embodiments of the present disclosure.

FIGS. 6A-6B are schematic diagrams illustrating a MEMS device that includes a magnetic coating to attract a magnet to be in proximity to the MEMS device in accordance with embodiments of the present disclosure.

FIGS. 7A-7B are schematic diagrams illustrating a chassis that includes a magnetic element to align a magnet to be in proximity to a MEMS device in accordance with embodiments of the present disclosure.

FIG. 10 is a schematic diagram of an imaging system in accordance with embodiments of the present disclosure.

Figures are not drawn to scale.

DETAILED DESCRIPTION

Figure 1:
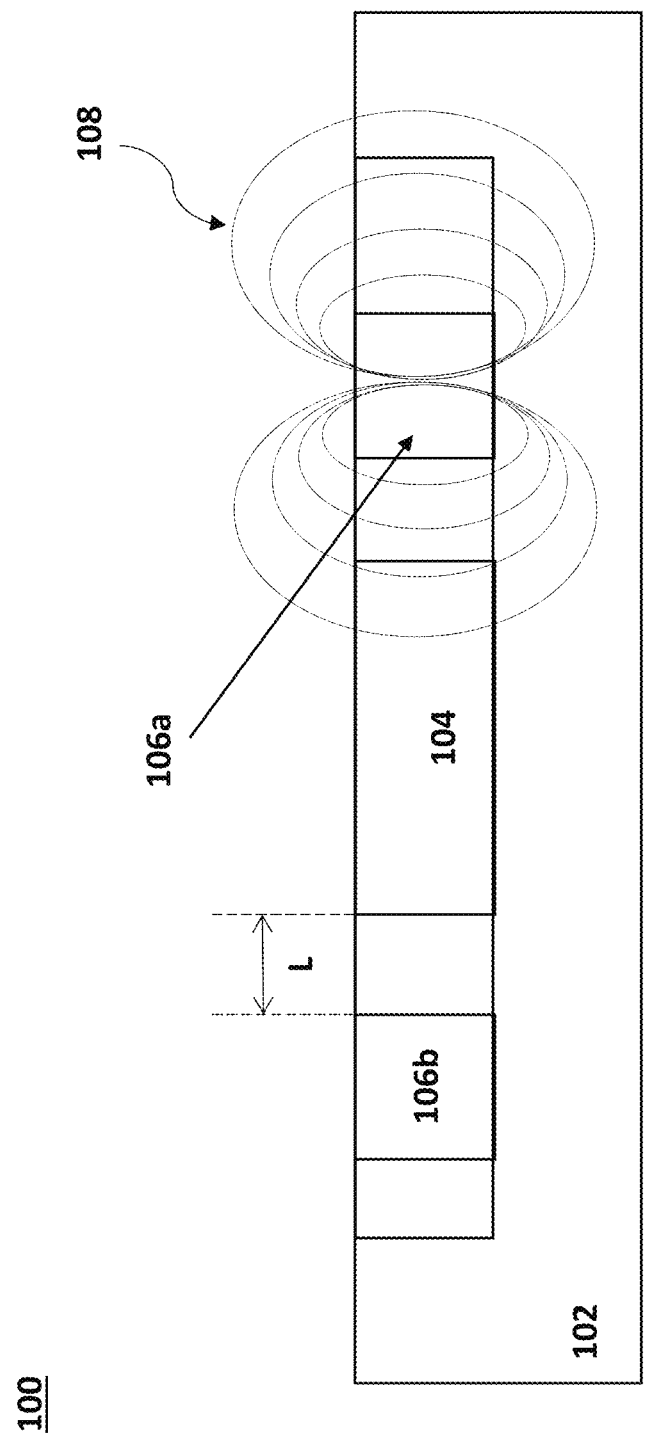
FIG. 1 is a schematic diagram of a device chassis that includes a micro-electro-mechanical systems (MEMS) device and the magnetic field interaction between a magnet and the MEMS device.

This disclosure describes closing the gap between a magnet 106a and a MEMS device 104 after pick and placing. FIG. 1 is a schematic diagram of a device chassis 102 that includes a micro-electro-mechanical systems (MEMS) device 104 and the magnetic field interaction 108 between a magnet 106a and the MEMS device 104. A magnet 106a can be positioned on the chassis 102 via a pick and place tool to place the magnet 106a with some tolerance or distance from the MEMS device (shown as distance L, which is the distance between magnet 106b and the MEMS device 104—it is understood that the magnet is a distance L (or substantially a distance L) from the MEMS device 104). The MEMS device 104 can be secured to the chassis 102 by conventional techniques so that the MEMS device 104 is rigidly affixed to the chassis 102.

Figure 2C:
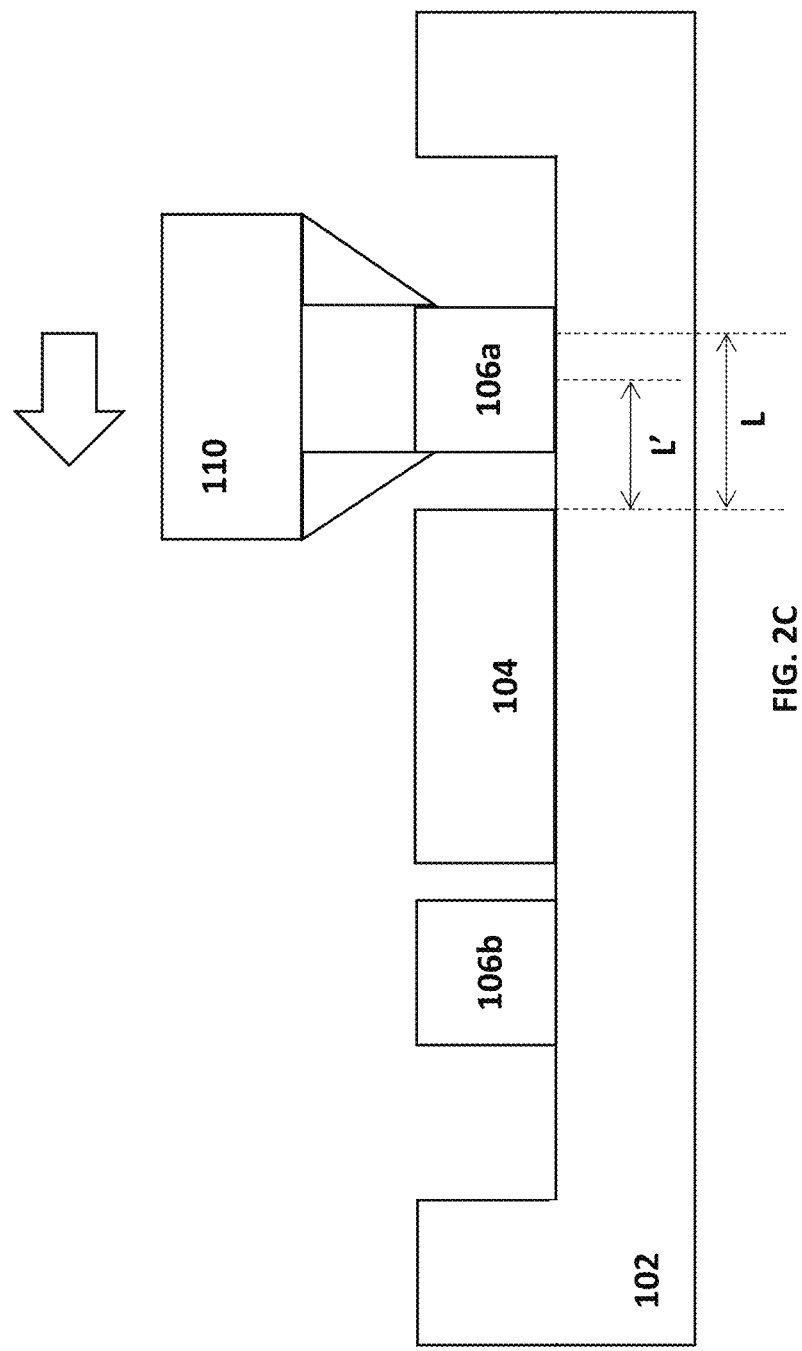

FIGS. 2A-2C are schematic diagrams illustrating picking and placing a magnet onto a chassis. FIG. 2A is a schematic diagram 200 of a pick and place tool 110 that can pick up a magnet 106a and align the magnet 106a over the chassis 102 at a location separate from the MEMS device 104 by a distance L. The placement location is shown by the dotted line. FIG. 2B is a schematic diagram 220 illustrating a pick and place tool 110 placing the magnet 106a onto the chassis at the location on the chassis a distance L from the MEMS device 104. FIG. 2C is a schematic diagram 230 of how the pick and place tool 110 can move (or scoot) the magnet 106a towards the MEMS device 104 to a final location at a distance L' from the MEMS device, where L>L'. If L is too large, a second step may be employed, which is to move the magnet closer to the MEMS. The scoot step may require new pick and place tooling, impacts throughput time, and may cause damage to the MEMS if not calibrated correctly. These factors all increase cost and negatively impact the magnetic field and/or magnetic performance.

This disclosure describes reducing L by relying on non-contact methods that occur after conventional pick and place of the magnet, and can be executed in a batch fashion (e.g., curing epoxy) so that throughput time is minimally impacted.

Figure 3C:
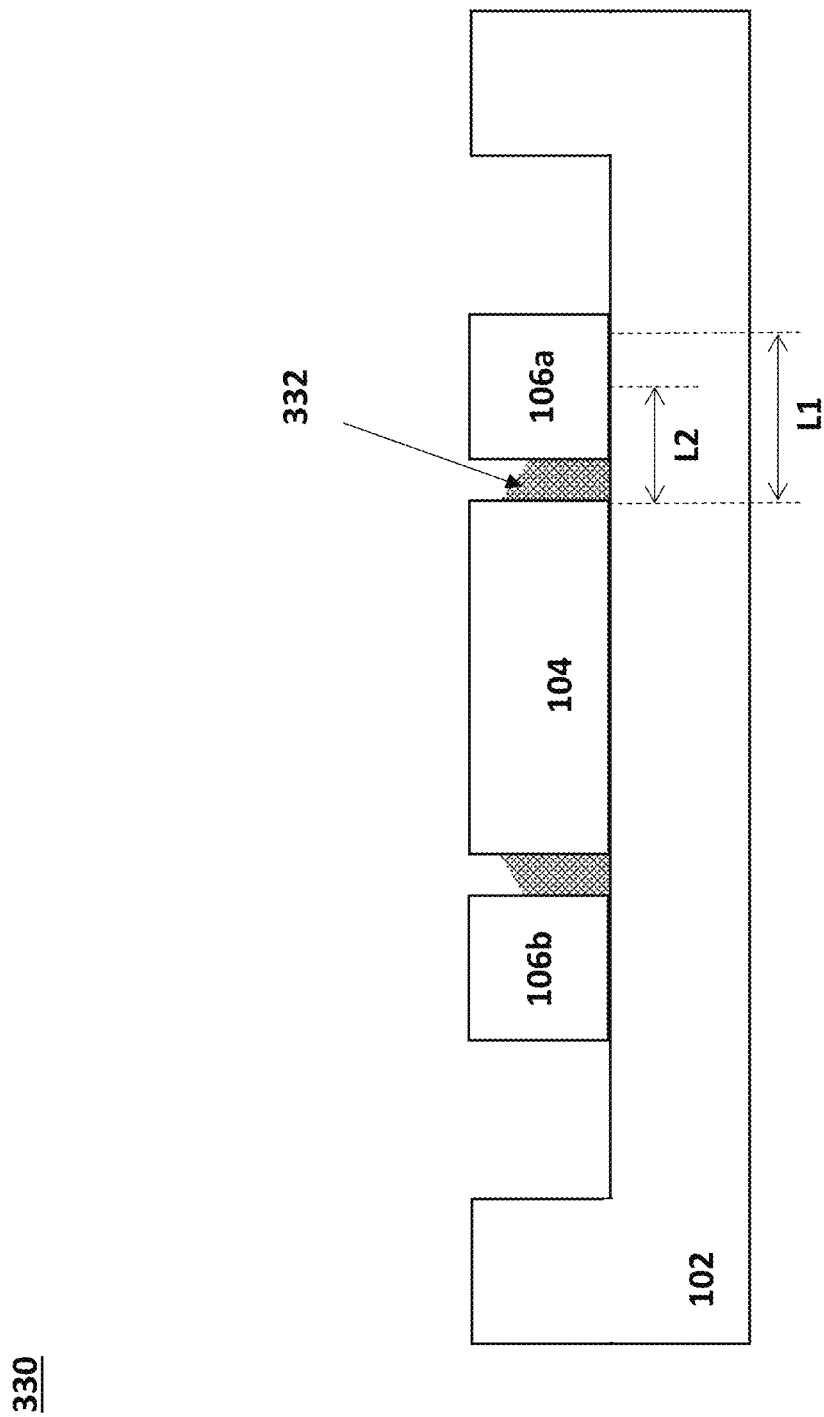

FIGS. 3A-3C are schematic diagrams illustrating an example application of a shrinking epoxy for coupling a magnet to a MEMS device in accordance with embodiments of the present disclosure. FIGS. 3A-3C illustrate the use of an adhesive 304 that is dispensed between the MEMS device 104 and magnets 106a and 106b. In this case the magnets have already been pick and placed onto chassis 102, as shown in FIGS. 2A-2B, but the distance between the MEMS device 104 and the magnet 106a, L1, is unacceptably large for adequate magnetic interaction between the magnet 106a and the MEMS device 104. In FIG. 3A, the adhesive 304 can be a resin, multifunctional epoxy, anhydride, phoenolic, or other type of adhesive. The adhesive 304 can be functionalized to shrink as a result of curing to pull the magnets closer to the MEMS. In another scenario, they may contain ferromagnetic fillers, and provides direct magnetic coupling between the magnets and the MEMS.

FIG. 3A is a schematic diagram 300 of an adhesive dispensing tool 304 that can dispense an adhesive 302 between the MEMS device 104 and the magnets 106a and 106b. The adhesive dispensing tool 304 can move from one location to another to dispense the adhesive 302 at the correct location. FIG. 3B is a schematic diagram 320 showing the applied adhesive 322 prior to curing. The dispensed adhesive 322 contacts the magnet 106a and the MEMS device 104. The magnet 106a is located at a distance L1 from the MEMS device 104 prior to curing the dispensed adhesive 322.

FIG. 3C is a schematic diagram 330 illustrating a cured adhesive 332 between the magnet 106a and the MEMS device 104. The adhesive can bind to the MEMS device 104 and the magnet 106a as a result of curing. Also as a result of curing, the cured adhesive 332 can shrink and pull the magnet 106a towards the MEMS device 104. The magnet 106a can be stopped from colliding with the MEMS device 104 by the cured adhesive 322. The magnet 106a can stop at a distance L2 from the MEMS device 104. The distance L2 can be a determined based on the amount that the adhesive 322 shrinks as a result of curing and the amount of adhesive that is used. A similar process can be used to move magnet 106b towards MEMS device 104.

In embodiments, the adhesive 302 can include ferromagnetic particles or elements that can enhance the magnetic coupling between the magnets 106a and 106b and the MEMS device 104.

Figure 4A:
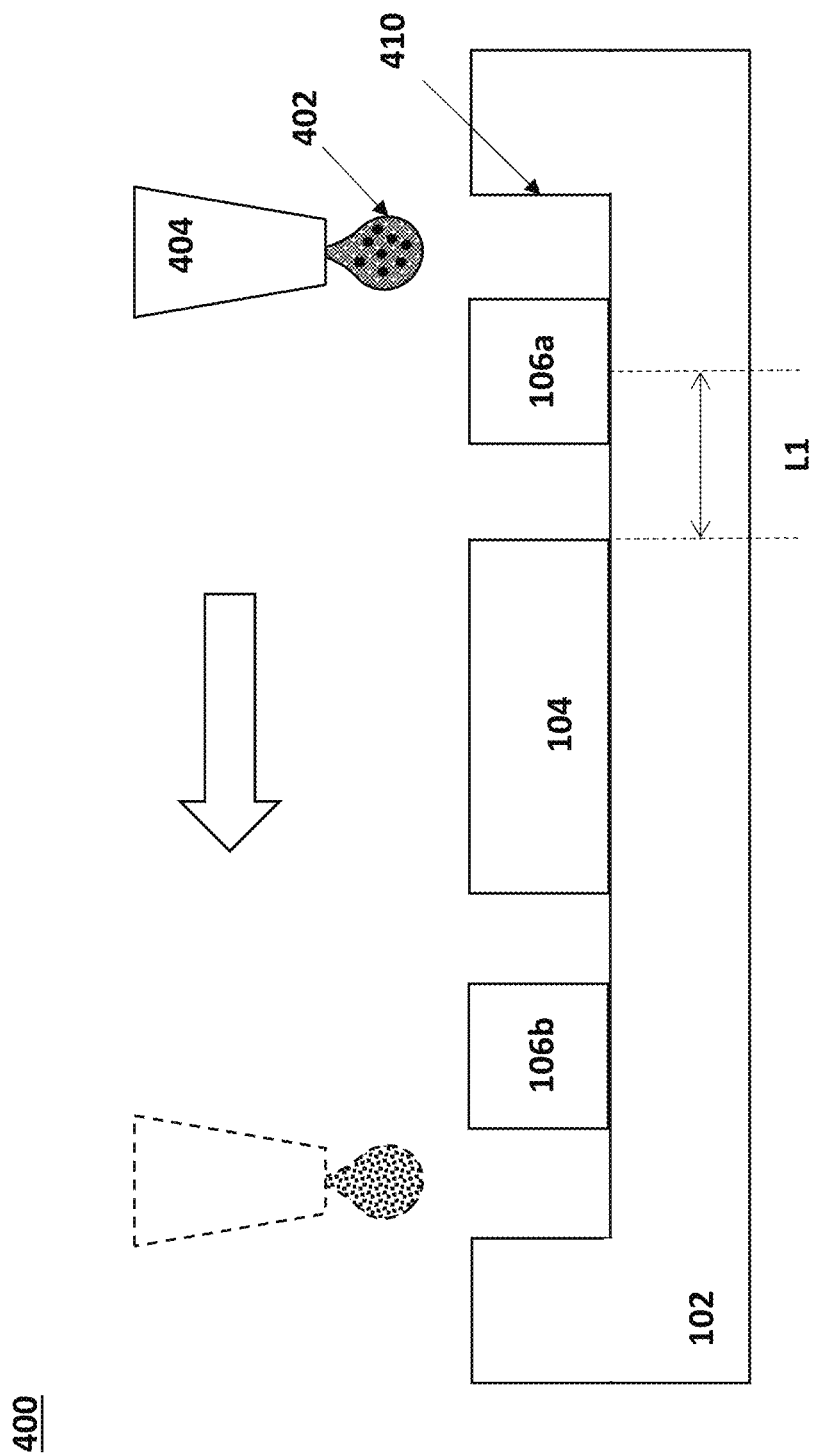
FIGS. 4A-4C are schematic diagrams illustrating an example application of an expanding epoxy for coupling a magnet to a MEMS device in accordance with embodiments of the present disclosure.
Figure 4B:
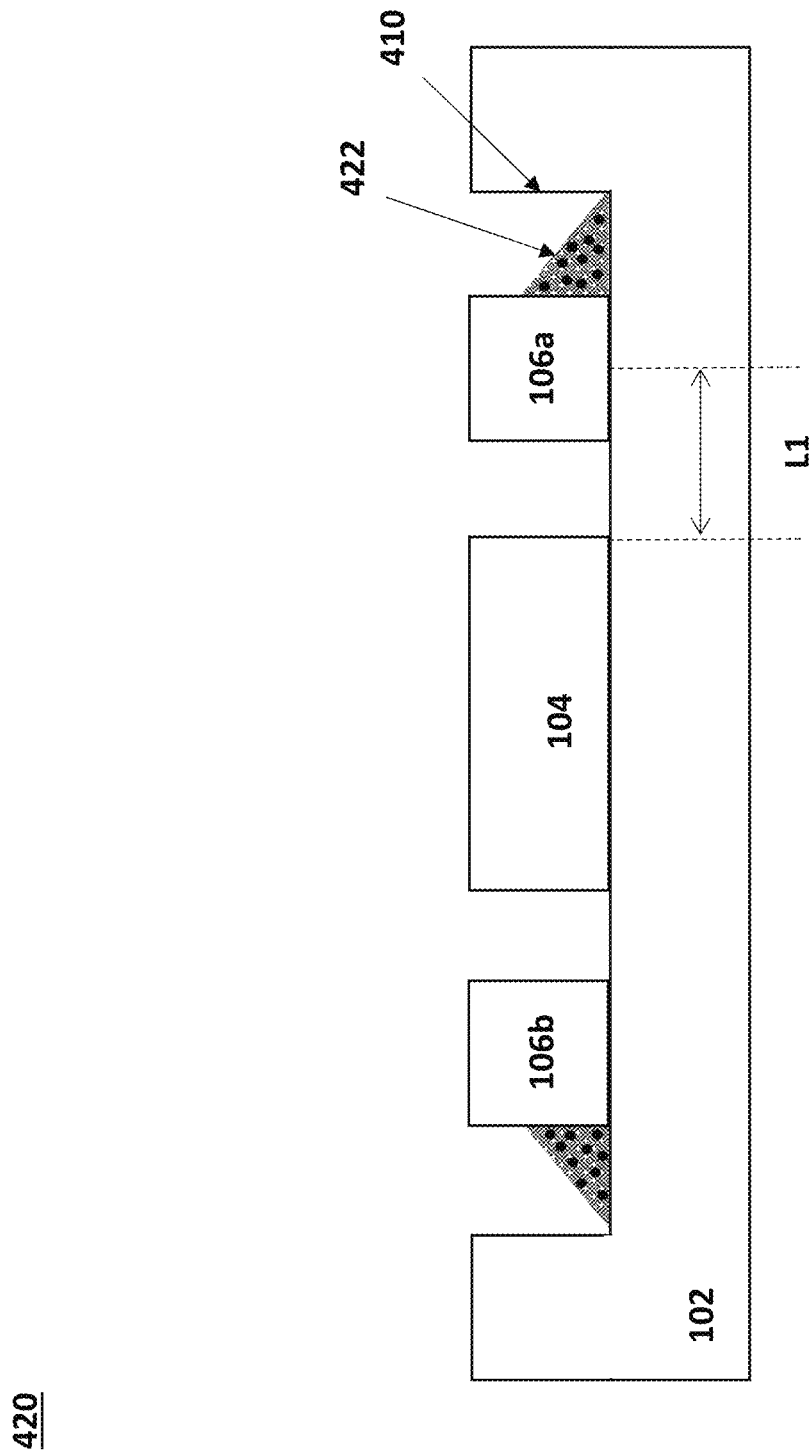
Figure 4C:
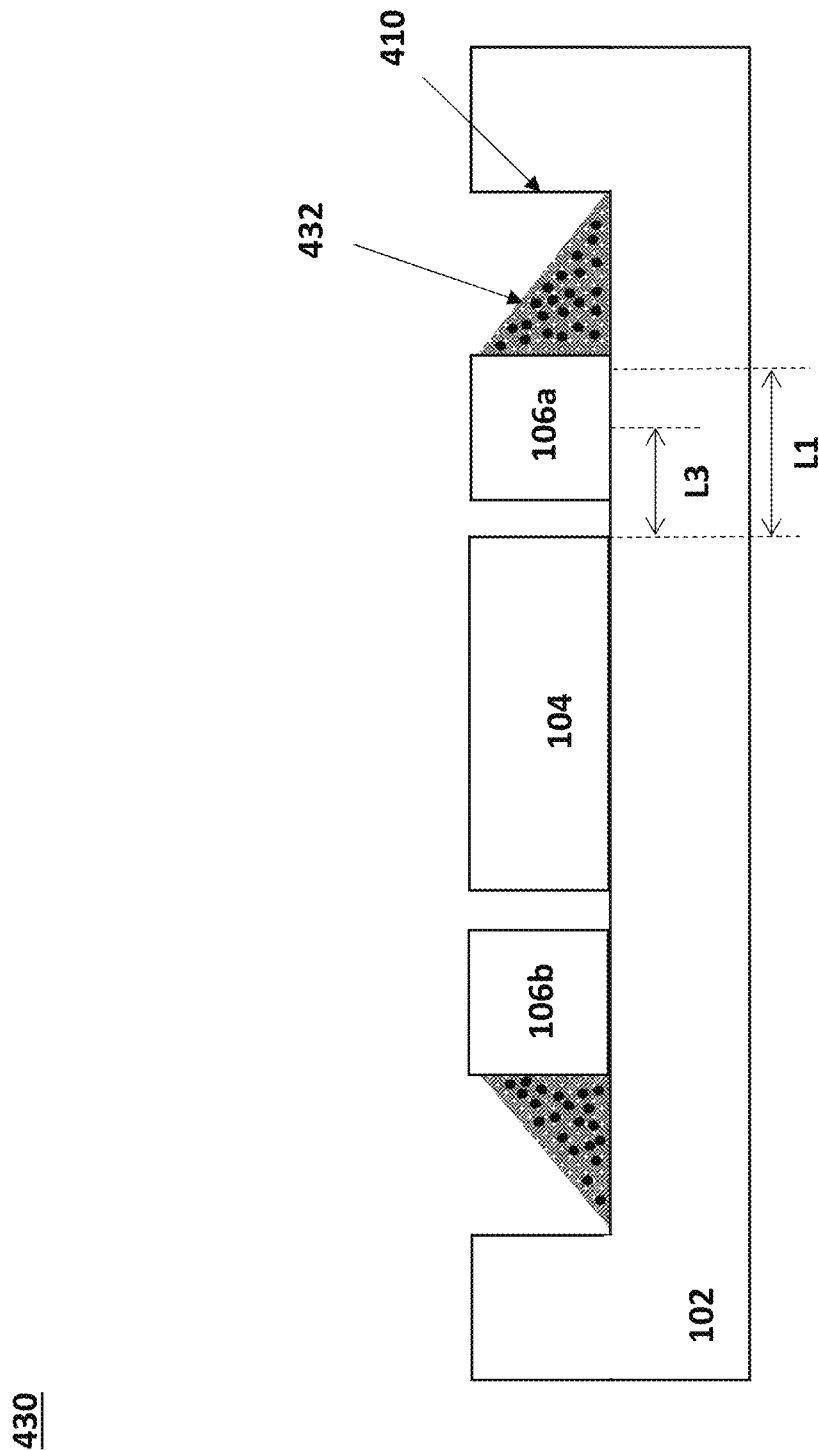

FIGS. 4A-4C are schematic diagrams illustrating an example application of an expanding adhesive 402 for coupling a magnet 106a to a MEMS device 104 in accordance with embodiments of the present disclosure. FIG. 4A is a schematic diagram 400 illustrating an adhesive dispensing tool 404 (similar to that shown in FIG. 3A) that can dispense an adhesive 402 that expands as a result of curing. The adhesive 402 can be an expanding fast cure adhesive material. The adhesive 402 can, in some embodiments, include ferromagnetic particles to enhance magnetic coupling between the magnet 106a and the chassis 102. The adhesive 402 can be a resin, epoxy, anhydride, phoenolic, etc. composition containing curing agents (for photo/thermal/moisture cure), magnetic particles, and foaming agents (foaming agents with and without encapsulation). The adhesive dispensing tool 404 can dispense the adhesive 404 onto a location on the chassis 102 between the magnet 106a and a sidewall 410 of the chassis 102. The adhesive dispensing tool 404 can then move to dispense the adhesive 402 at a location between magnet 106b and the chassis sidewall.

FIG. 4B is a schematic diagram 420 illustrating the uncured adhesive 422 on the chassis 102 between magnet 106a and the chassis sidewall 410. The magnet 106a resides on the chassis 102 at a distance L1 from the MEMS device 104 having been placed at that location by a pick and place tool, similar to that shown in FIG. 2B. The uncured adhesive 422 is shown to include ferromagnetic particles, but embodiments can include adhesives that do not include ferromagnetic particles.

FIG. 4C is a schematic diagram 430 illustrating the expanded adhesive 432. As a result of curing, the adhesive 432 can bind to the magnet 106a. Also as a result of curing, the adhesive 432 can expand to push the magnet 106a towards the MEMS device 104. As a result of pressure change in the adhesive due to thermal exposure/stimuli, the foaming agent in the adhesive expands and pushes the magnet 106a closer to the MEMS device 104. The adhesive be cured in place (snap cured by photo/photo+thermal, photo+moisture cure) at a location having a distance L3 from the MEMS device 104, where L1>L3.

Figure 5A:
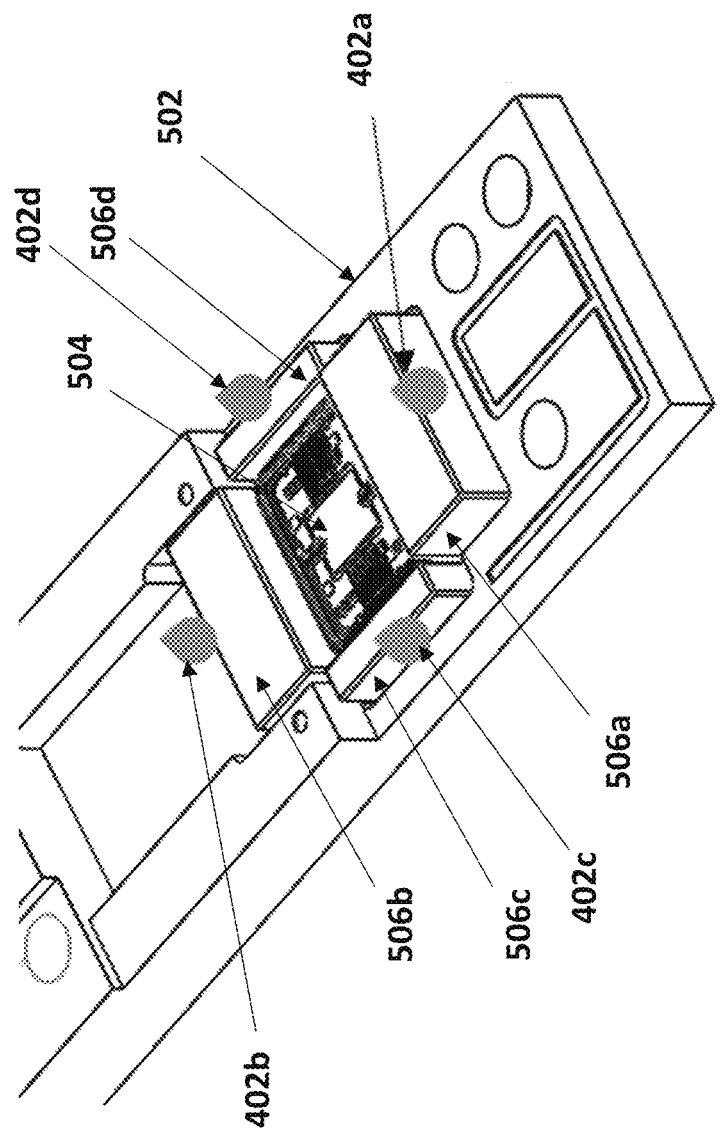
FIG. 5A is a schematic diagram of an example optical chip in accordance with embodiments of the present disclosure.

FIG. 5A is a schematic diagram of an optical chip 500 in accordance with embodiments of the present disclosure. FIG. 5A illustrates an isometric view of an optical chip (or a portion of an optical chip) 500. The optical chip 500 includes a chassis 502 that is similar to that described above for chassis 102. The chassis 502 can hold a microelectromechanical system (MEMS) device 504. MEMS device 504 can be an optical elements, such as a scanning micro-mirror. The MEMS device 504 can be magnetically actuated by one or more magnetic elements 506a, 506b, 506c, and 506d. The one or more magnetic elements 506a, 506b, 506c, and 506d can be placed on the chassis 502 by a pick-and-place tool (not shown). The magnetic elements 506a, 506b, 506c, and 506d can be secured by an adhesive 402 (shown in FIG. 4A). For example, the magnetic element 506a can be secured by an adhesive 402a dispensed between the magnetic element 506a and a sidewall of the chassis 502. For example, the magnetic element 506b can be secured by an adhesive 402b dispensed between the magnetic element 506b and a sidewall of the chassis 502. For example, the magnetic element 506c can be secured by an adhesive 402c dispensed between the magnetic element 506c and a sidewall of the chassis 502. For example, the magnetic element 506d can be secured by an adhesive 402d dispensed between the magnetic element 506d and a sidewall of the chassis 502.

Figure 5B:
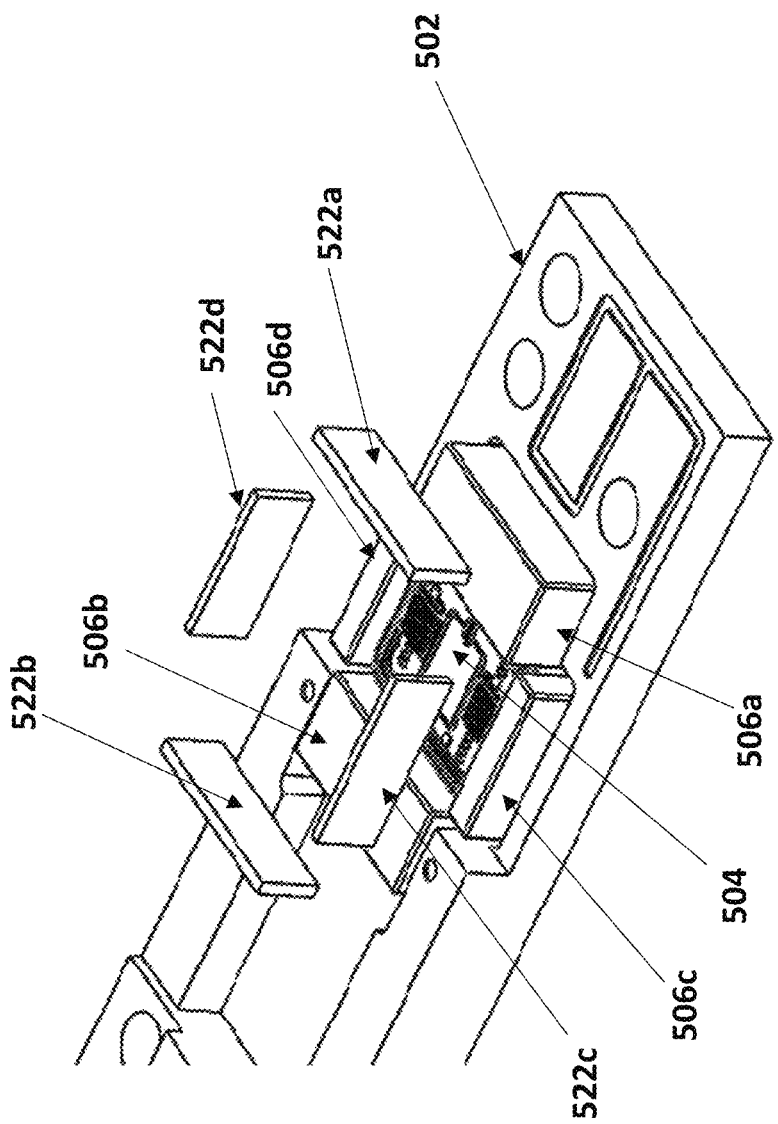
FIG. 5B is a schematic diagram of another example optical chip in accordance with embodiments of the present disclosure.

FIG. 5B is a schematic diagram of another example optical chip 520 in accordance with embodiments of the present disclosure. In embodiments, the adhesive applied between the magnetic elements and the chassis sidewall can be an adhesive film or foam. For example, the magnetic element 506a can be secured by an adhesive film 522a placed or dispensed between the magnetic element 506a and a sidewall of the chassis 502. For example, the magnetic element 506b can be secured by an adhesive 522b placed or dispensed between the magnetic element 506b and a sidewall of the chassis 502. For example, the magnetic element 506c can be secured by an adhesive 522c placed or dispensed between the magnetic element 506c and a sidewall of the chassis 502. For example, the magnetic element 506d can be secured by an adhesive 522d placed or dispensed between the magnetic element 506d and a sidewall of the chassis 502.

Figure 6B:
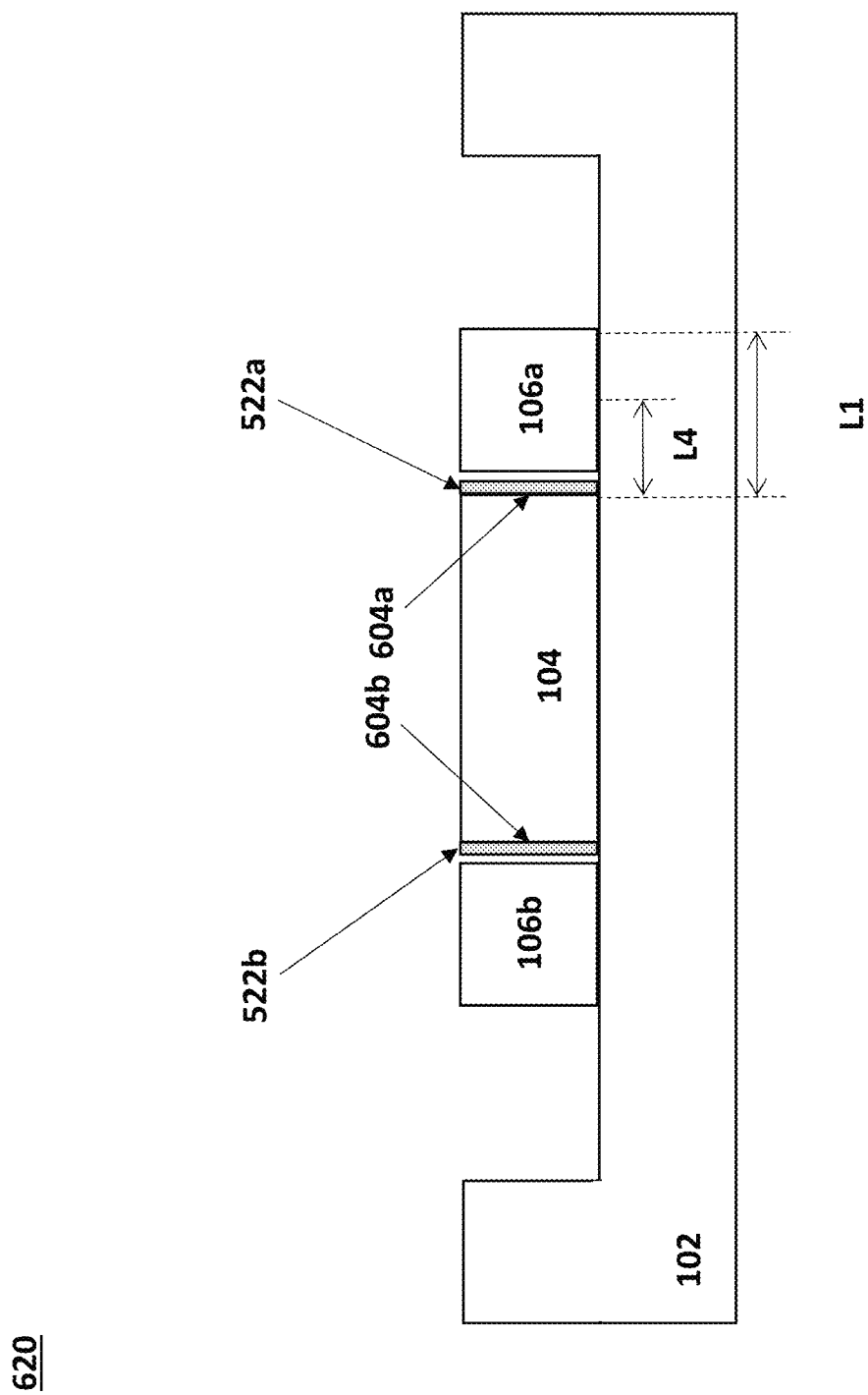

FIGS. 6A-6B are schematic diagrams illustrating a MEMS device that includes a magnetic coating to attract a magnet to be in proximity to the MEMS device in accordance with embodiments of the present disclosure. FIG. 6A is a schematic diagram 600 showing a magnetic coating 602a can reside on a sidewall 604a of the MEMS device 104 (and similarly, a magnetic coating 602b can reside on a sidewall 604b of MEMS device 104). In one example, scenario a magnetic coating is applied to the sidewall of the MEMS device. This magnetic coating 604a can enhance the magnetic coupling between the magnet 106a and the MEMS device 104. In this example embodiment, the magnet 106a can remain at a location having a distance L1 from the MEMS device 104.

FIG. 6B is a schematic diagram 620 showing a magnetic coating 622a that is strong enough to also exert a pull on the magnet 106a to draw magnet 106a closer to the MEMS device 104. As shown in FIG. 6B, the magnet 106a resides at a position L4, where L1>L4.

Figure 7A:
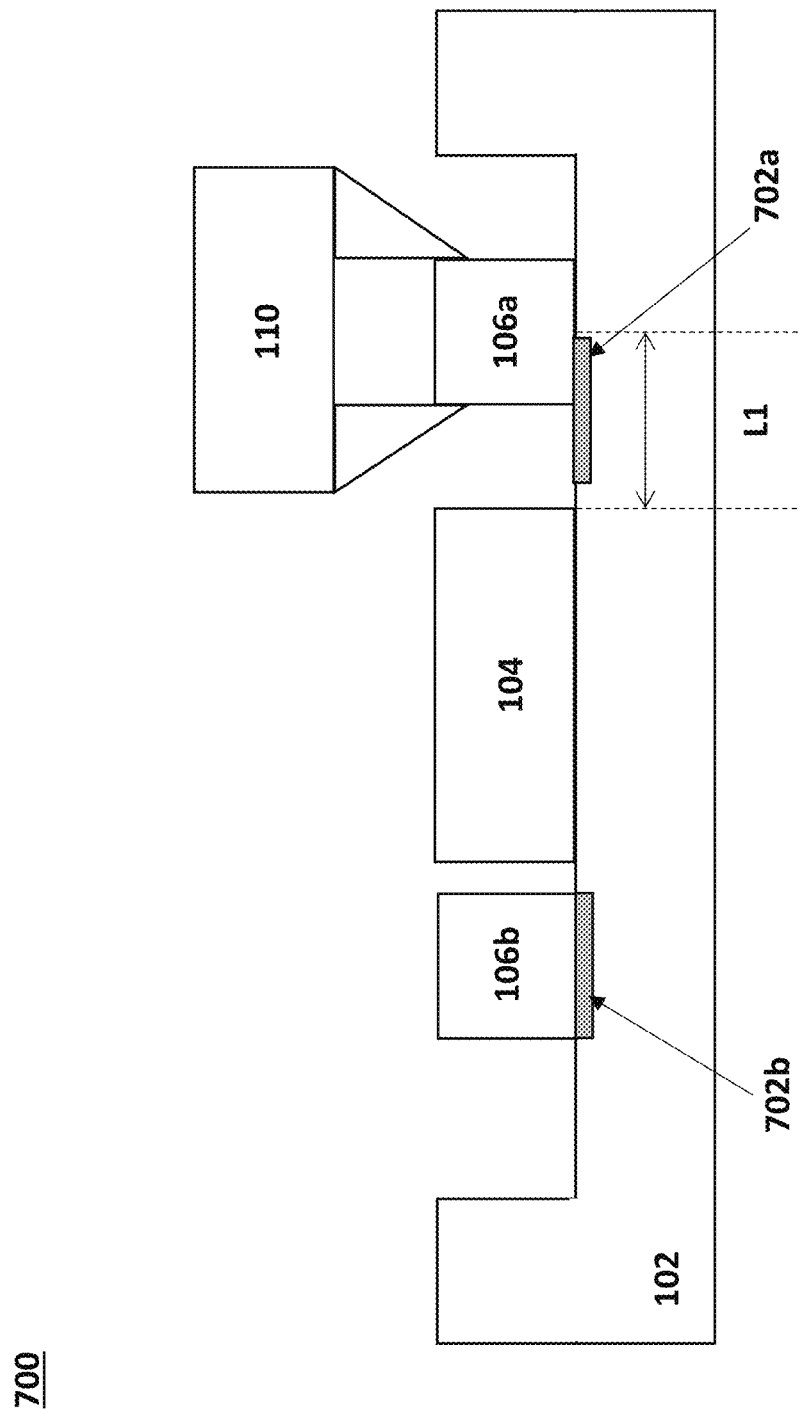

FIGS. 7A-7B are schematic diagrams illustrating a chassis that includes a magnetic element 702a to align a magnet to be in proximity to a MEMS device 104 in accordance with embodiments of the present disclosure. FIG. 7A is a schematic diagram 700 that illustrates placing of a magnet 106a by a pick and place tool 110 on to a chassis 102. The magnetic element 702a can be a high permeability magnetic coating that can be applied to the chassis 102. In embodiments, the magnetic element 702a can be an integrated magnetic element on the surface of the chassis 102. The magnetic element 702a can be close to the MEMS device 104. Similarly, a magnetic element 702b can be close to the MEMS device 104 to align and secure magnet 106b. FIG. 7B is a schematic diagram 720 showing how the magnetic element 702a can be aligned and secured to the chassis at a position L5. After magnet 702a is picked and placed to a location at a distance L1 from the MEMS device 104, then the magnetic element 702a footprint can help self-align the magnet 106a to a smaller distance L5, where L1>L5.

Figure 8:
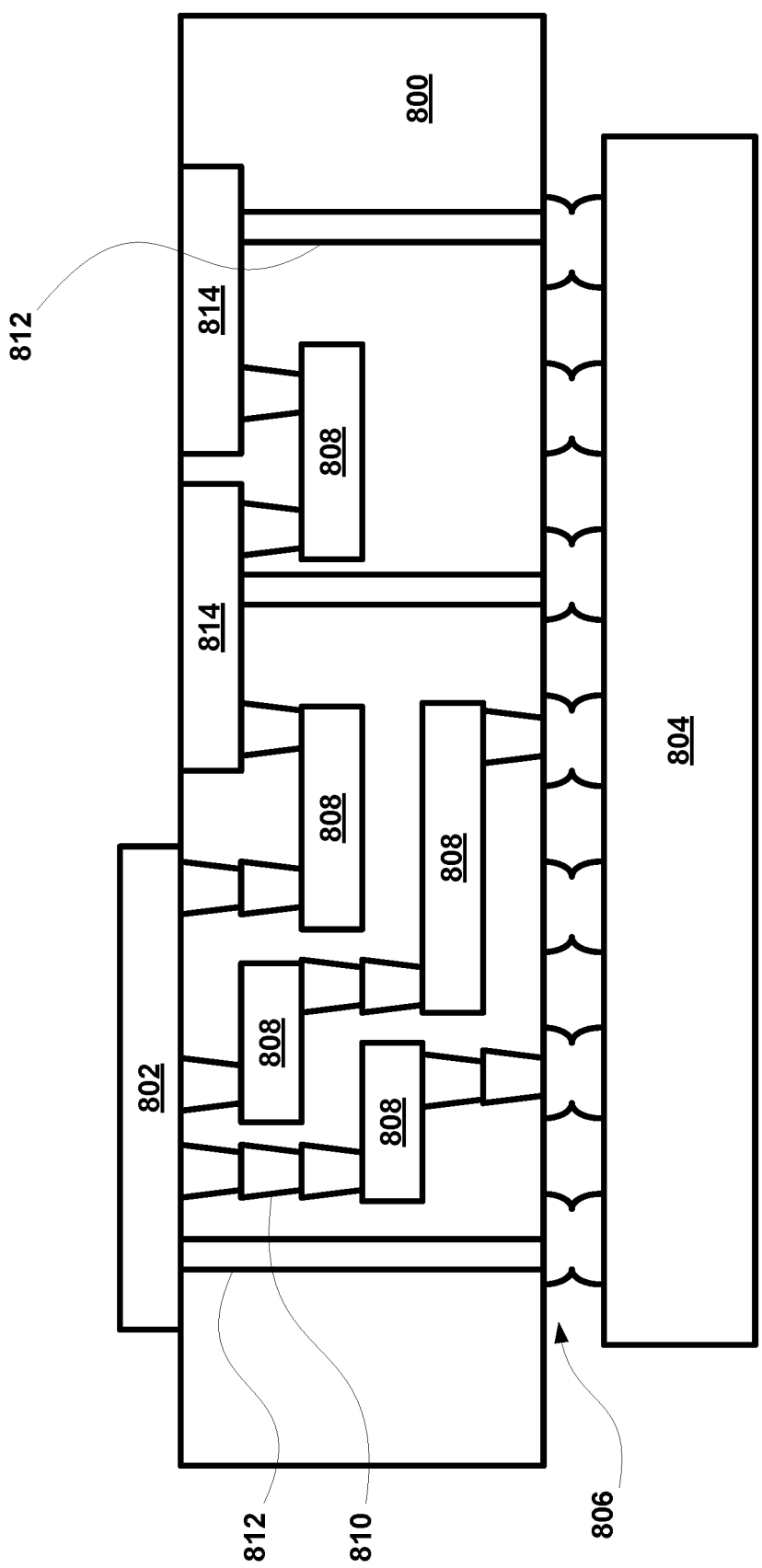
FIG. 8 illustrates an interposer that includes one or more embodiments of the disclosure.

FIG. 8 illustrates an interposer 800 that includes one or more embodiments of the disclosure. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800.

In accordance with embodiments of the disclosure, apparatuses or processes disclosed herein may be used in the fabrication of interposer 800.

Figure 9:
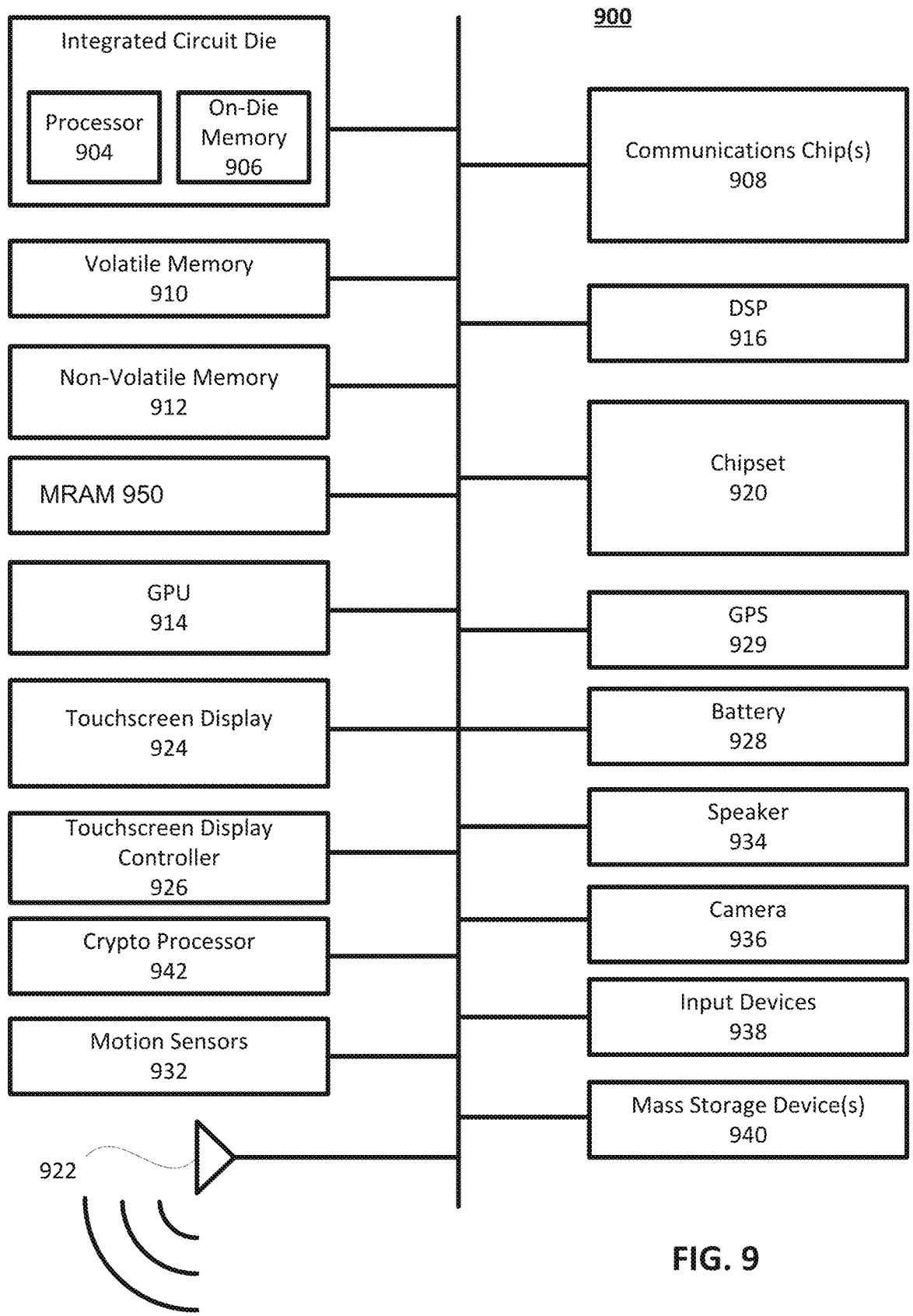
FIG. 9 illustrates a computing device in accordance with one embodiment of the disclosure.

FIG. 9 illustrates a computing device 900 in accordance with one embodiment of the disclosure. The computing device 900 may include a number of components. In one embodiment, these components are attached to one or more motherboards. In an alternate embodiment, some or all of these components are fabricated onto a single system-on-a-chip (SoC) die. The components in the computing device 900 include, but are not limited to, an integrated circuit die 902 and at least one communications logic unit 908. In some implementations the communications logic unit 908 is fabricated within the integrated circuit die 902 while in other implementations the communications logic unit 908 is fabricated in a separate integrated circuit chip that may be bonded to a substrate or motherboard that is shared with or electronically coupled to the integrated circuit die 902. The integrated circuit die 902 may include a CPU 904 as well as on-die memory 906, often used as cache memory, that can be provided by technologies such as embedded DRAM (eDRAM) or spin-transfer torque memory (STTM or STT-MRAM).

Computing device 900 may include other components that may or may not be physically and electrically coupled to the motherboard or fabricated within an SoC die. These other components include, but are not limited to, volatile memory 910 (e.g., DRAM), non-volatile memory 912 (e.g., ROM or flash memory), a graphics processing unit 914 (GPU), a digital signal processor 916, a crypto processor 942 (a specialized processor that executes cryptographic algorithms within hardware), a chipset 920, an antenna 922, a display or a touchscreen display 924, a touchscreen controller 926, a battery 928 or other power source, a power amplifier (not shown), a voltage regulator (not shown), a global positioning system (GPS) device 928, a compass 930, a motion coprocessor or sensors 932 (that may include an accelerometer, a gyroscope, and a compass), a speaker 934, a camera 936, user input devices 938 (such as a keyboard, mouse, stylus, and touchpad), and a mass storage device 940 (such as hard disk drive, compact disk (CD), digital versatile disk (DVD), and so forth).

The communications logic unit 908 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 908 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communications logic units 908. For instance, a first communications logic unit 908 may be dedicated to shorter range wireless communications such as Wi-Fi and Bluetooth and a second communications logic unit 908 may be dedicated to longer range wireless communications such as GPS, EDGE, GPRS, CDMA, WiMAX, LTE, Ev-DO, and others.

In various embodiments, the computing device 900 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

FIG. 10 is a schematic diagram of an imaging system 1000 in accordance with embodiments of the present disclosure. Imaging system 100 can include a light emitter 1002. Light emitter can include a laser, laser diode, light emitting diode, or other light source. In embodiments, the light emitter can include a collimator, such as a collimating lens 1006. The imaging system 100 can include a light steering device 1004. Light steering device 1004 can include a MEMS micro-mirror, such as a scanning micro-mirror that is magnetically actuated. The imaging system 1000 can also include a photosensitive element 1008. Photosensitive element 1008 can be a charge coupled device (CCD), photodiode, or other light detection device. A focusing lens 1010 can direct light towards to the photosensitive element 1008. The imaging system 1000 can also include a processor 1012. Processor 1012 can be an analog front end, image processor, ASIC, or other processor configured for processing information from the photosensitive element 1008 and for image processing.

The light steering device 1004 can include a chassis, as shown in FIGS. 5A-5B. The light steering device 1004 can include one or more magnetic elements mounted on the chassis. In embodiments, an adhesive material can reside between the magnetic elements and the chassis. The adhesive material can including an expanding material, such as a foaming agent, that expands as a result of a stimulus. The adhesive material can include ferromagnetic particles to enhance magnetic conductivity between the magnetic element(s) and the chassis.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

The relative sizes of features shown in the figures are not drawn to scale.

The following paragraphs provide examples of various ones of the embodiments disclosed herein.

Example 1 is an apparatus that includes a chassis; a microelectromechanical systems (MEMS) device residing on the chassis; a magnetic element residing on the chassis proximate to the MEMS device; and an adhesive material contacting the magnetic element, wherein the MEMS device and the magnetic element are magnetically coupled.

Example 2 may include the subject matter of example 1, wherein the adhesive is in contact with the magnetic element and the MEMS device.

Example 3 may include the subject matter of example 1, wherein the adhesive is in contact with the magnetic element and a sidewall of the chassis.

Example 4 may include the subject matter of example 3, wherein the adhesive comprises a foaming agent.

Example 5 may include the subject matter of any of examples 1 or 2 or 3, wherein the adhesive comprises a ferromagnetic filler.

Example 6 may include the subject matter of any of examples 1-5, wherein the adhesive comprises one of an epoxy, an epoxy hybrid resin, or a composite resin matrix.

Example 7 may include the subject matter of any of examples 1-5, wherein the adhesive comprises one or more of a resin, a multifunctional epoxy, anhydride, or phoenolic.

Example 8 is an imaging system that includes a chassis; a microelectromechanical device secured to the chassis; a magnetic element secured to the chassis proximate the MEMS device; and an adhesive material contacting the magnetic element, wherein the MEMS device and the magnetic element are magnetically coupled. In embodiments, the MEMS device can be an optical element, such as a scanning micro-mirror (e.g., a 1D or 2D scanning micro-mirror).

Example 9 may include the subject matter of example 8, wherein the adhesive is in contact with the magnetic element and the MEMS device.

Example 10 may include the subject matter of example 8, wherein the adhesive is in contact with the magnetic element and a sidewall of the chassis.

Example 11 may include the subject matter of example 10, wherein the adhesive comprises a foaming agent.

Example 12 may include the subject matter of any of examples 8 or 9 or 10, wherein the adhesive comprises a ferromagnetic filler.

Example 13 may include the subject matter of any of examples 8 or 9 or 10 or 11, wherein the adhesive comprises one of an epoxy, an epoxy hybrid resin, or a composite resin matrix.

Example 14 may include the subject matter of any of examples 8 or 9 or 10 or 11 or 12, wherein the adhesive comprises one or more of a resin, a multifunctional epoxy, anhydride, or phoenolic.

Example 15 may include the subject matter of any of examples, 8-14, wherein the MEMS device comprises a magnetically controllable optical element.

Example 16 may include the subject matter of any of examples 8-15, wherein the magnetic element comprises a permanent magnet.

Example 17 is a method that includes placing a magnetic element onto a chassis at a first distance from a microelectromechanical systems (MEMS) device; applying an adhesive to the chassis at a location adjacent to the magnetic element; and curing the adhesive to move the magnetic element to a second distance from the MEMS device, wherein the second distance is less than the first distance.

Example 18 may include the subject matter of example 17, wherein applying the adhesive to the chassis comprises applying an expanding epoxy film to the chassis at a location between the magnetic element and a sidewall of the chassis, wherein the adhesive is configured to adhere to the magnetic element and the MEMS device and expand as a result of curing.

Example 19 may include the subject matter of example 17, wherein applying the adhesive to the chassis comprises applying the adhesive to the chassis at a location between the magnetic element and a sidewall of the chassis, wherein the adhesive is configured to adhere to the magnetic element and expand as a result of curing.

Example 20 may include the subject matter of any of examples 17-19, wherein placing the magnetic element onto the chassis further comprises moving the magnetic element towards the MEMS device using a pick and place tool.

Example 21 is an apparatus that includes a microelectromechanical systems (MEMS) device residing on a chassis, the chassis comprising a magnetic element integrated into a surface of the chassis at a location adjacent the MEMS device; a permanent magnet residing on the magnetic element integrated into the surface of the chassis proximate to the MEMS device; and wherein the MEMS device and the permanent magnet are magnetically coupled.

Example 22 is a method that includes placing a permanent magnet onto a chassis at a first distance from a microelectromechanical systems (MEMS) device, the chassis comprising a magnetic element integrated into the chassis proximate to the MEMS device, wherein placing the permanent magnet comprises placing the permanent magnet partially onto the magnetic element; and releasing the permanent magnet to allow the magnetic element to align the permanent magnet towards the MEMS device to a second distance from the MEMS device, the second distance less than the first distance.

Example 23 is an apparatus that includes a microelectromechanical systems (MEMS) device residing on a chassis, the MEMS device comprising a magnetic material residing on a side surface of the MEMS device; a permanent magnet residing on the chassis proximate to the MEMS device; and wherein the MEMS device and the permanent magnet are magnetically coupled.

Example 24 is a method that includes placing a permanent magnet onto a chassis at a first distance from a microelectromechanical systems (MEMS) device, the MEMS device comprising a magnetic material on a side surface of the MEMS device; and releasing the permanent magnet to allow the permanent magnet to move towards the MEMS device based on a magnetic attraction with the magnetic material.

Example 25 is a computing device that includes a processor mounted on a substrate; a communications logic unit within the processor; a memory within the processor; a graphics processing unit within the computing device; an antenna within the computing device; a display on the computing device; a battery within the computing device; a power amplifier within the processor; a voltage regulator within the processor; and an imaging system. The imaging system can include a light emitter; a photosensitive element; and a light steering device. The light steering device can include a chassis; a microelectromechanical system (MEMS) device secured to the chassis; a magnetic element secured to the chassis proximate the MEMS device; and an adhesive material contacting the magnetic element, wherein the MEMS device and the magnetic element are magnetically coupled.

Example 26 may include the subject matter of example 25, wherein the MEMS device comprises a magnetically controllable optical element.

Example 27 may include the subject matter of any of examples 25-26, wherein the adhesive is in contact with the magnetic element and a sidewall of the chassis.

Example 28 may include the subject matter of any of examples 25-27, wherein the adhesive comprises a foaming agent.

Example 29 may include the subject matter of any of examples 25-28, wherein the adhesive comprises a ferromagnetic filler.

In the preceding description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure; however, the order of description should not be construed to imply that these operations are necessarily order dependent. In particular, these operations need not be performed in the order of presentation.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

What is claimed is:

1. An apparatus, comprising:
   a chassis;
   a microelectromechanical systems (MEMS) device on the chassis;
   a magnetic element on the chassis, proximate to the MEMS device; and
   an adhesive material contacting the magnetic element, wherein the MEMS device and the magnetic element are magnetically coupled, and the magnetic element is between the MEMS device and the adhesive material.

2. The apparatus of claim 1, wherein the adhesive material is in contact with the magnetic element and a sidewall of the chassis.

3. The apparatus of claim 2, wherein the adhesive material comprises a foaming agent.

4. The apparatus of claim 1, wherein the adhesive material comprises one of an epoxy, an epoxy hybrid resin, or a composite resin matrix.

5. The apparatus of claim 1, wherein the adhesive material comprises one or more of a resin, a multifunctional epoxy, anhydride, or phoenolic.

6. An imaging system, comprising:
   a light emitter;
   a photosensitive element; and
   a light steering device, comprising:
      a chassis;
      a microelectromechanical (MEMS) device secured to the chassis;
      a magnetic element secured to the chassis, proximate to the MEMS device; and
      an adhesive material contacting the magnetic element, wherein the MEMS device and the magnetic element are magnetically coupled, and (1) the adhesive material includes a ferromagnetic filler and is between the magnetic element and the MEMS device or (2) the magnetic element is between the MEMS device and the adhesive material.

7. The imaging system of claim 6, wherein the adhesive material comprises one of an epoxy, an epoxy hybrid resin, or a composite resin matrix.

8. The imaging system of claim 6, wherein the adhesive material comprises one or more of a resin, a multifunctional epoxy, anhydride, or phoenolic.

9. The imaging system of claim 6, wherein the MEMS device comprises a magnetically controllable optical element.

10. The imaging system of claim 6, wherein the magnetic element comprises a permanent magnet.

11. The imaging system of claim 6, wherein the adhesive material includes a ferromagnetic filler and is between the magnetic element and the MEMS device.

12. The imaging system of claim 11, wherein the adhesive material is in contact with the magnetic element and the MEMS device.

13. The imaging system of claim 6, wherein the magnetic element is between the MEMS device and the adhesive material.

14. The imaging system of claim 13, wherein the adhesive material is in contact with the magnetic element and a sidewall of the chassis.

15. The imaging system of claim 13, wherein the adhesive material comprises a foaming agent.

16. A computing device, comprising:
a processor mounted on a substrate; and
an imaging system, the imaging system comprising:
  a light emitter;
  a photosensitive element; and
  a light steering device, comprising:
    a chassis;
    a microelectromechanical system (MEMS) device secured to the chassis;
    a magnetic element secured to the chassis, proximate to the MEMS device; and
    an adhesive material contacting the magnetic element,
    wherein the MEMS device and the magnetic element are magnetically coupled, and (1) the adhesive material includes a ferromagnetic filler and is between the magnetic element and the MEMS device or (2) the magnetic element is between the MEMS device and the adhesive material.

17. The computing device of claim 16, wherein the MEMS device comprises a magnetically controllable optical element.

18. The computing device of claim 16, wherein the adhesive material includes a ferromagnetic filler and is between the magnetic element and the MEMS device.

19. The computing device of claim 16, wherein the magnetic element is between the MEMS device and the adhesive material.

20. The computing device of claim 19, wherein the adhesive material is in contact with the magnetic element and a sidewall of the chassis.

* * * * *

UNITED STATES PATENT AND TRADEMARK OFFICE
CERTIFICATE OF CORRECTION

PATENT NO. : 11,022,792 B2
APPLICATION NO. : 16/464257
DATED : June 1, 2021
INVENTOR(S) : Kyle Yazzie et al.

Page 1 of 1

It is certified that error appears in the above-identified patent and that said Letters Patent is hereby corrected as shown below:

In the Specification

In Column 2, Line 49, delete "phoenolic." and insert -- phenolic. --, therefor.

In Column 3, Line 27, delete "phoenolic." and insert -- phenolic. --, therefor.

In Column 7, Line 53, delete "phoenolic." and insert -- phenolic. --, therefor.

In Column 8, Line 14, delete "phoenolic." and insert -- phenolic. --, therefor.

In the Claims

In Column 10, Claim 5, Line 28, delete "phoenolic." and insert -- phenolic. --, therefor.

In Column 10, Claim 8, Line 50, delete "phoenolic." and insert -- phenolic. --, therefor.

Signed and Sealed this
Tenth Day of August, 2021

Drew Hirshfeld
*Performing the Functions and Duties of the
Under Secretary of Commerce for Intellectual Property and
Director of the United States Patent and Trademark Office*